United States Patent
Yeo et al.

(10) Patent No.: US 7,301,206 B2
(45) Date of Patent: Nov. 27, 2007

(54) SEMICONDUCTOR-ON-INSULATOR SRAM CONFIGURED USING PARTIALLY-DEPLETED AND FULLY-DEPLETED TRANSISTORS

(75) Inventors: Yee-Chia Yeo, Hsin-Chu (TW); Fu-Liang Yang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 426 days.

(21) Appl. No.: 10/700,869

(22) Filed: Nov. 4, 2003

(65) Prior Publication Data

US 2005/0023633 A1      Feb. 3, 2005

Related U.S. Application Data (60) Provisional application No. 60/491,698, filed on Aug. 1, 2003.

(51) Int. Cl.
  *H01L 29/76*     (2006.01)
(52) U.S. Cl. .................................... 257/369
(58) Field of Classification Search ........... 257/67, 257/350, 351, 353, 500, 347, 369, 393, 903, 257/371; 365/154, 51
See application file for complete search history.

(56) References Cited

U.S. PATENT DOCUMENTS

| | | | |
|---|---|---|---|
| 4,314,269 A | 2/1982 | Fujiki | |
| 4,631,803 A | 12/1986 | Hunter et al. | |
| 4,946,799 A | 8/1990 | Blake et al. | |
| 5,447,884 A | 9/1995 | Fahey et al. | |
| 5,461,250 A | 10/1995 | Burghartz et al. | |
| 5,534,713 A | 7/1996 | Ismail et al. | |
| 5,607,865 A | 3/1997 | Choi et al. | |
| 5,629,544 A | 5/1997 | Voldman et al. | |
| 5,714,777 A | 2/1998 | Ismail et al. | |
| 5,763,315 A | 6/1998 | Benedict et al. | |
| 5,770,881 A | 6/1998 | Pelella et al. | |
| 5,811,857 A | 9/1998 | Assaderaghi et al. | |
| 6,008,095 A | 12/1999 | Gardner et al. | |
| 6,015,993 A | 1/2000 | Voldman et al. | |

(Continued)

FOREIGN PATENT DOCUMENTS

WO    WO 03/017336 A2    2/2003

OTHER PUBLICATIONS

Yang, F.-L.., et al., "Strained FIP-SOI (FinFET/FD/PD-SOI) for Sub-65 nm CMOS Scaling." 2003 Symposium on VLSI Technology Digest of Technical Papers (Jun. 2003) pp. 137-138.

(Continued)

*Primary Examiner*—Howard Weiss
*Assistant Examiner*—(Vikki) Hoa B. Trinh
(74) *Attorney, Agent, or Firm*—Slater & Matsil, L.L.P.

(57) ABSTRACT

A static memory element includes a first inverter having an input coupled to a left bit node and an output coupled to a right bit node. A second inverter has an input coupled to the right bit node and an output coupled to the left right bit node. A first fully depleted semiconductor-on-insulator transistor has a drain coupled to the left bit node, and a second fully depleted semiconductor-on-insulator transistor has a drain coupled to the right bit node.

45 Claims, 6 Drawing Sheets

U.S. PATENT DOCUMENTS

| | | | |
|---|---|---|---|
| 6,040,991 | A | 3/2000 | Ellis-Monaghan et al. |
| 6,046,487 | A | 4/2000 | Benedict et al. |
| 6,059,895 | A | 5/2000 | Chu et al. |
| 6,061,267 | A * | 5/2000 | Houston ............ 365/154 |
| 6,198,173 | B1 | 3/2001 | Huang |
| 6,222,234 | B1 | 4/2001 | Imai |
| 6,232,163 | B1 | 5/2001 | Voldman et al. |
| 6,258,664 | B1 | 7/2001 | Reinberg |
| 6,291,321 | B1 | 9/2001 | Fitzgerald |
| 6,294,834 | B1 | 9/2001 | Yeh et al. |
| 6,341,083 | B1 | 1/2002 | Wong |
| 6,342,410 | B1 | 1/2002 | Yu |
| 6,358,791 | B1 | 3/2002 | Hsu et al. |
| 6,387,739 | B1 | 5/2002 | Smith, III |
| 6,413,802 | B1 | 7/2002 | Hu et al. |
| 6,414,355 | B1 | 7/2002 | An et al. |
| 6,429,061 | B1 | 8/2002 | Rim |
| 6,448,114 | B1 | 9/2002 | An et al. |
| 6,475,838 | B1 | 11/2002 | Bryant et al. |
| 6,475,869 | B1 | 11/2002 | Yu |
| 6,489,664 | B2 | 12/2002 | Re et al. |
| 6,524,905 | B2 | 2/2003 | Yamamichi et al. |
| 6,525,403 | B2 | 2/2003 | Inaba et al. |
| 6,549,450 | B1 | 4/2003 | Hsu et al. |
| 6,555,839 | B2 | 4/2003 | Fitzgerald |
| 6,558,998 | B2 | 5/2003 | Belleville et al. |
| 6,605,514 | B1 | 8/2003 | Tabery et al. |
| 6,611,029 | B1 | 8/2003 | Ahmed et al. |
| 6,621,131 | B2 | 9/2003 | Murthy et al. |
| 6,635,909 | B2 | 10/2003 | Clark et al. |
| 6,642,090 | B1 | 11/2003 | Fried et al. |
| 6,653,700 | B2 | 11/2003 | Chau et al. |
| 6,720,619 | B1 | 4/2004 | Chen et al. |
| 6,762,448 | B1 | 7/2004 | Lin et al. |
| 6,855,990 | B2 | 2/2005 | Yeo et al. |
| 6,867,433 | B2 | 3/2005 | Yeo et al. |
| 2002/0076899 | A1 | 6/2002 | Skotnicki et al. |
| 2002/0153549 | A1 | 10/2002 | Laibowitz et al. |
| 2002/0190284 | A1 | 12/2002 | Murth et al. |
| 2003/0001219 | A1 | 1/2003 | Chau et al. |
| 2003/0030091 | A1 | 2/2003 | Bulsara et al. |
| 2003/0080386 | A1 | 5/2003 | Ker et al. |
| 2004/0007715 | A1 | 1/2004 | Webb et al. |
| 2004/0026765 | A1 | 2/2004 | Currie et al. |
| 2004/0031979 | A1 | 2/2004 | Locktefeld et al. |
| 2004/0061178 | A1 | 4/2004 | Lin et al. |
| 2004/0075122 | A1 | 4/2004 | Lin et al. |

OTHER PUBLICATIONS

Kuang, J.B., et al., "SRAM Bitline Circuits on PD SPOI: Advantages and Concerns," IEEE Journal of Solid-State Circuits, vol. 32, No. 6 (Jun. 1997) pp. 837-844.

Shimizu, A., et al., "Local Mechanical-Stress Control (LMC): A New Technique for CMOS-Performance Enhancement," IEDM 2001 (Dec. 2001) pp. 433-436.

Blaauw, D., et al., "Gate Oxide and Subthreshold Leakage Characterization, Analysis and Optimization," date unknown, 2 pages.

Cavassilas, N., et al., "Capacitance-voltage Characteristica of Metal-Oxide-Strained Semiconductor Si/SiGe Heterostructures," Nanotech 2002, vol. 1, pp. 600-603.

Celik, M., et al., "A 45mm Gate Length High Performance SOI Transistors for 100nm CMOS Technology Applications," 2002 Symposium on VLSI Technology, Digest of Technical Papers, pp. 166-167.

Chang, L., et al., "Direct-Tunneling Gate Leakage Current in Double-Gate and Ultrathin Body MOSFETs," 2002 IEEE, vol. 49, No. 12, pp. 2288-2295, Dec. 2002.

Chang, L., et al., "Reduction of Direct-Tunneling Gate Leakage Current in Double-Gate and Ultra-Thin Body MOSFETs," 2001 IEEE, Berkeley, CA.

Chau, R., et al., "A 50 mm Depleted-substrate CMOS Transistor (DST)," International Electron Device Meeting 2001, Technical Digest, pp. 621-624.

Chen, W., et al., "Suppression of the SOI Floating-body Effects by Linked-body Device Structure," 1996 Symposium on VLSI Technology, Digest of Technical Papers, pp. 92-93.

Fung, SK.H., et al., "Gate Length Scaling to 30nm Regime Using Ultra-thin Film PD-SOI Technology," International Electron Device Meeting 2001, Technical Digest, pp. 629-632.

Gámiz, F., et al., "Electron Transport in Strained Si Inversion Layers Grown on SiGe-on-Insulator Substrates," Journal of Applied Physics, vol. 92, No. 1, (Jul. 1, 2002), pp. 288-295.

Gámiz, F., et al., "Strained-Si/SiGe-on-Insulator Inversion Layers: The Role of Strained-Si Layer Thickness on Electron Mobility," Applied Physics Letters, vol. 80, No. 22, (Jun. 3, 2002), pp. 4160-4162.

Geppert, L., "The Amazing Vanishing Transistor Act," Oct. 2002, IEEE Spectrum, pp. 28-33.

Huang, X., et al. "Sub-50 nm P-Channel FinFET," IEEE Transactions on Electron Devices, vol. 48, No. 5 (May 2001) pp. 880-886.

Ismail, K., et al., "Electron Transport Properties of Si/SiGe Heterostructures: Measurements and Device Implications," Applied Physics Letters, vol. 63, No. 5 (Aug. 2, 1993), pp. 660-662.

Jurczak M., et al., "Silicon-on-Nothing (SON) - an Innovative Process for Advanced CMOS," IEEE Transactions on Electron Devices, vol. 47, No. 11, (Nov. 2000), pp. 2179-2187.

Jurczak M., et al., "SON (Silicon-on-Noting) - A New Device Architecture For The ULSI Era," Symposium on VLSI Technology Digest of Technical Papers, (1999), pp. 29-30.

Maiti, C.K., et al., "Film Growth and Material Parameters," Application of Silicon-Germanium Heterostructure, Institute of Physics Publishing, Ch. 2 (2001) pp. 32-42.

Matthews, J.W., et al., "Defects Associated with the Accommodation of Misfit Between Crystals," J. Vac. Sci. Technol., vol. 12, No. 1, (Jan./Feb. 1975), pp.126-133.

Matthews, J.W., et al., "Defects in Epitaxial Multilayers - I. Misfit Dislocations," Journal of Crystal Growth, vol. 27, (1974), pp. 118-125.

Matthews, J.W., et al., "Defects in Epitaxial Multilayers - II. Dislocation Pile-Ups, Threading Dislocation, Slip Lines and Cracks" Journal of Crystal Growth, vol. 29, (1975), pp. 273-280.

Matthews, J.W., et al., "Defects in Epitaxial Multilayers - III. Preperation of Almost Perfect Multilayers," Journal of Crystal Growth, vol. 32, (1976), pp. 265-273.

Mizuno, T., et al. "Novel SOI p-Channel MOSFETs With Higher Strain in Si Channel Using Double SiGe Heterostructures," IEEE Transactions on Electron Devices, vol. 49, No. 1 (Jan 2002) pp. 7-14.

Nayak, D.K., et al. "Enhancement-Mode Quantum-Well $Ge_xSi_{1-x}$ PMOS," IEEE Electron Device Letters, vol. 12, No. 4 (Apr. 1991), pp. 154-156.

Ootsuka, F., et al., "A Highly Dense, High-Performance 130nm Node CMOS Technology for Large Scale System-on-a-Chip Application," International Electron Device Meeting, (2000), pp. 575-578.

Schüppen, A., et al., "Mesa and Planar SiGe-HBTs on MBE-Wafers," Journal of Materials Science: Materials in Electronics, vol. 6, (1995), pp. 298-305.

Shahidi, G.G., "SOI Technology for the GHz era," IBM Journal of Research and Development, vol. 46, No. 2/3 (Mar./May 2002), pp. 121-131.

Tezuka, T., et al., "High-performance Strained Si-on-Insulator MOSFETs by Novel Fabrication Processes Utilizing Ge-Condensation Technique," Symposium On VLSI Technology Digest of Technical Papers, (2002).

Thompson, S., et al. "A 90 nm Logic Technology Featuring 50nm Strained Silicon Channel Transistors, 7 layers of Cu Interconnects, Low k ILD, and 1 um2 SRAM cell," International Electron Devices Meeting.

Tiwari, S., et al., "Hole Mobility Improvement in Silicon-on-Insulator and Bulk Silicon Transistors Using Local Strain," International Electron Device Meeting, (1997), pp. 939-941.

Wang, L.K., et al., "On-Chip Decoupling Capacitor Design to Reduce Switching-Noise-induced Instability in CMOS/SOI VLSI," Proceedings of the 1995 IEEE International SOI Conference, Oct. 1995, pp. 100-101.

Welser, J., et al. "NMOS and PMOS Transistors Fabricated in Strained Silicon/Relaxed Silicon-Germaniun Structures," International Electron Devices Meeting (Dec. 1992) pp. 1000-1002.

Wong, H.-S.P., "Beyond the Conventional Transistor,"IBM Journal of Research and Development (Mar./May 2002), pp. 133-167.

Yang, F.L., et al. "25nm CMOS Omega FETs," International Electron Devices Meeting, Digest of Technical Papers, (Dec. 2002) pp. 255-258.

Yang, F.L., et al., "35nm CMOS FinFETs," 2002 Symposium on VLSI Technology Digest of Technical Papers, (Jun. 2002), pp. 104-105.

Yeoh, J.C., et al., "MOS Gated Si:SiGe Quantum Wells Formed by Anodic Oxidation," Semicond. Sci. Technol. (1998), vol. 13, pp. 1442-1445, IOP Publishing Ltd., UK.

* cited by examiner

SEMICONDUCTOR-ON-INSULATOR SRAM CONFIGURED USING PARTIALLY-DEPLETED AND FULLY-DEPLETED TRANSISTORS

This application claims the benefit of U.S. Provisional Application No. 60/491,698, filed on Aug. 1, 2003, entitled "Semiconductor-on-Insulator SRAM Configured Using Partially-Depleted and Fully-Depleted Transistors," which application is hereby incorporated herein by reference.

CROSS-REFERENCE TO RELATED APPLICATIONS

The following U.S. patents and/or commonly assigned patent applications are hereby incorporated herein by reference:

| U.S. Pat. or Ser. No. | Filing Date | Issue Date | Attorney Docket No. |
|---|---|---|---|
| 10/305,841 | Nov. 26, 2002 | Feb. 15, 2005 | TSMC2002-0895 |
| 10/319,119 | Dec. 12, 2002 | Apr. 13, 2004 | TSMC2002-0979 |
| 10/426,566 | Apr. 30, 2003 | Mar. 15, 2005 | TSMC2003-0111 |

TECHNICAL FIELD

The present invention relates generally to semiconductor devices and, more particularly, the preferred embodiment relates to a semiconductor-on-insulator SRAM configured using partially-depleted and fully-depleted transistors.

BACKGROUND

The desire for higher performance circuits has driven the development of high-speed sub-100 nanometer (nm) silicon-on-insulator (SOI) complementary metal-oxide-semiconductor (CMOS) technology. In SOI technology, metal-oxide semiconductor field-effect transistors (MOSFETs) are formed on a thin layer of silicon overlying a layer of insulating material such as silicon oxide. Devices formed on SOI offer many advantages over their bulk counterparts, including reduced junction capacitance, absence of reverse body effect, soft-error immunity, full dielectric isolation, and absence of latch-up. SOI technology therefore enables higher speed performance, higher packing density, and reduced power consumption.

The most commonly used and most manufacturable SOI technology is partially-depleted SOI (PD-SOI) technology where transistors fabricated have a partially-depleted body region, that is, a PD-SOI transistor is one in which the body thickness is thicker than the maximum depletion layer width $W_{d,max}$, so that a region of the body is undepleted. The undepleted body of the PD-SOI transistor is not tied to any voltage and is commonly described as being a floating body region.

Although PD-SOI transistors have the merit of being highly manufacturable, significant design burden is faced by its users because of floating body effects. In PD-SOI transistors, charge carriers generated by impact ionization near the drain/source region accumulate near the source/drain region of the transistor. When sufficient carriers accumulate in the floating body, which is formed right below the channel region, the body potential is effectively altered.

Floating body effects occur in PD-SOI devices because of charge build-up in the floating body region. This results in kinks in the device current-voltage (I-V) curves, thereby degrading the electrical performance of the circuit. In general, the body potential of a PD-SOI device may vary during static, dynamic, or transient device operation, and is a function of many factors like temperature, voltage, circuit topology, and switching history. Due to the fact that the body potential of the PD-SOI transistor depends on switching history, the device characteristics therefore depend on switching history, giving rise to a phenomenon known as history effect. Therefore, circuit design using PD-SOI transistors is not straightforward, and there is a significant barrier for the adoption of PD-SOI technology or the migration from bulk-Si design to PD-SOI design.

SUMMARY OF THE INVENTION

The preferred embodiment of the present invention relates generally to the fabrication of semiconductor devices. More particularly, the preferred embodiment of the present invention relates to semiconductor-on-insulator static random-access memory (SRAM) cells incorporating partially-depleted, fully-depleted transistors.

In a first embodiment, a static memory element includes a first inverter having an input coupled to a left bit node and an output coupled to a right bit node. A second inverter has an input coupled to the right bit node and an output coupled to the left right bit node. A first fully depleted semiconductor-on-insulator transistor has a drain coupled to the left bit node, and a second fully depleted semiconductor-on-insulator transistor has a drain coupled to the right bit node.

As an example, one embodiment includes a memory array formed from a plurality of SRAM cells arranged in an n by m matrix. The array includes a number of complementary bit line pairs, each including a left bit line and a right bit line. Crossing the bit line pairs is a number of word lines. An SRAM cell is located at the intersection of each word line and bit line pair. Each SRAM cell includes first and second inverters including a p-channel semiconductor-on-insulator pull-up transistor and an n-channel semiconductor-on-insulator pull-down transistor. Each cell also includes a first and second fully depleted semiconductor-on-insulator transistor that serve as access transistors.

In a more specific embodiment, a CMOS SRAM cell includes a pair of p-channel fully depleted transistors (P-FDFETs), each having a common source coupled to a voltage potential and a gate coupled to a drain of the other P-FDFET. A pair of n-channel partially depleted transistors (N-PDFETs) each have a drain connected to the drain of the respective P-FDFET of the pair of P-FDFETs, a common source connected to ground, and a gate connected to the drain of an opposite P-FDFET of the pair of P-FDFETs. A pair of n-channel pass-gate transistors each has the drain respectively connected to a connection linking the respective drain of the N-PDFET of the pair of N-PDFETs to the drain of the P-FDFET of the pair of P-FDFETs. A complementary bit line is coupled to the source of the n-channel pass-gate transistor of the pair of n-channel pass-gate transistors. A word line is coupled to the gates of the n-channel pass-gate transistors.

Aspects of the present invention also provide a method of forming an SRAM cell. A silicon-on-insulator substrate includes a silicon layer overlying an insulator layer, e.g., an oxide. At least one active region is defined in the silicon layer. A gate dielectric layer is formed over the active region and a number of gate electrodes are formed overlying the gate dielectric layer. Source and drain regions are formed adjacent to the plurality of gate electrodes to form a fully depleted transistor and a partially depleted transistor.

Advantages of the preferred embodiment of this invention include providing a structure and method for the integration of fully-depleted and partially-depleted SOI transistors, as well as multiple-gate transistors. Aspects of this invention describes an SRAM cell structure that employs both FD-SOI and PD-SOI transistors; improved performance of SOI SRAM cell configured using FD-SOI and PD-SOI transistors; use of FD-SOI transistors as pass-gate transistors or access transistors eliminate problems associated with the transient bipolar effect; and use of FD-SOI transistors as pull-up transistors to eliminate problems associated with history effect.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention is related to application Ser. No. 10/305,841, now issued U.S. Pat. No. 6,855,990, entitled "Strained-Channel Multiple-Gate Transistor", filed Nov. 26, 2002, and Ser. No. 10/319,119, now issued U.S. Pat. No. 6,120,619, entitled "Semiconductor-on-Insulator Chip Incorporating Partially-Depleted, Fully-Depleted, and Multiple-Gate Devices", filed Dec. 12, 2002, and Ser. No. 10/426,566, now issued U.S. Pat. No. 6,867,433 a entitled "Semiconductor-on-Insulator Chip Incorporating Strained-Channel Partially-Depleted, Fully-Depleted, and Multiple-Gate Transistors," filed Apr. 30, 2003. Each of these applications is incorporated herein by reference. Aspects of the present invention build upon and provide improvements and applications of previous inventions described in the incorporated applications.

In one aspect, the present invention relates to static random access memory (SRAM). SRAM is commonly used in data processors for the storage of instructions and data. SRAM is generally used in data processors requiring optimally fast access rates. Recent SRAM designs have exploited the advantages of PD-SOI technology. By making SRAM on SOI substrates, performance enhancement of up to 20-30% may be achieved compared to SRAM made on bulk silicon (Si) substrates.

Figure 1:
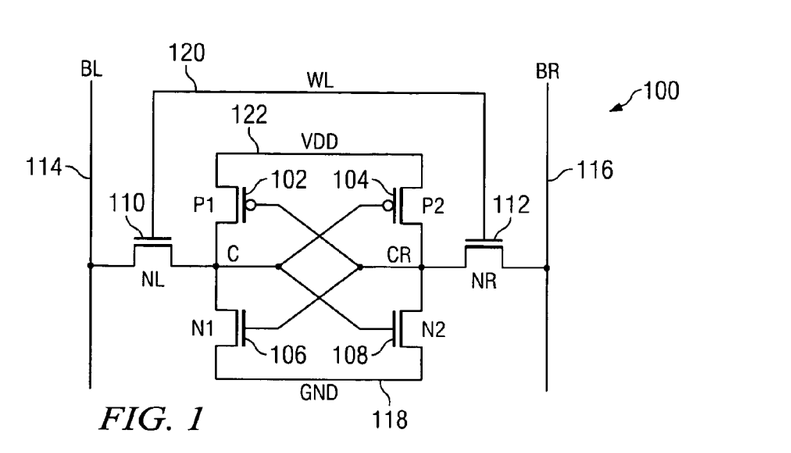
FIG. 1 is a schematic diagram of an SRAM that can utilize aspects of the present invention.

FIG. 1 shows a schematic diagram of a 6T (six transistor) CMOS SRAM cell 100. Such an SRAM cell 100 typically includes six metal-oxide-semiconductor field effect transistors (MOSFETs): two P-channel field-effect transistors (PFETs) 102 and 104 for a pull-up operation, two N-channel field-effect transistors (NFET) 106 and 108 for pull-down, and two NFETs 110 and 112 for input/output access, i.e. pass-gate access. As shown in FIG. 1, P1 and N1 form an inverter, which is cross-coupled with another inverter that includes P2 and N2. The devices 110 and 112 are pass-gate access devices that control reading from and writing into the SRAM cell 100.

The left bit line (BL) 114, the right bit line (BR) 116, the ground line (GND) 118 and supply node (VDD) 122 are also shown. The left bit line 114 carries a signal that is complementary to the signal carried on right bit line 116. As a result, the complementary bit line pair 114 and 116 (or 116 and 114) is sometimes referred to as bit line and bit line bar. A word line (WL) 120 is coupled to the gates of the pass transistors 110 and 112 so that a logic value stored in the memory cell 100 can be placed on the bit lines 114 and 116 or vice versa.

Figure 2:
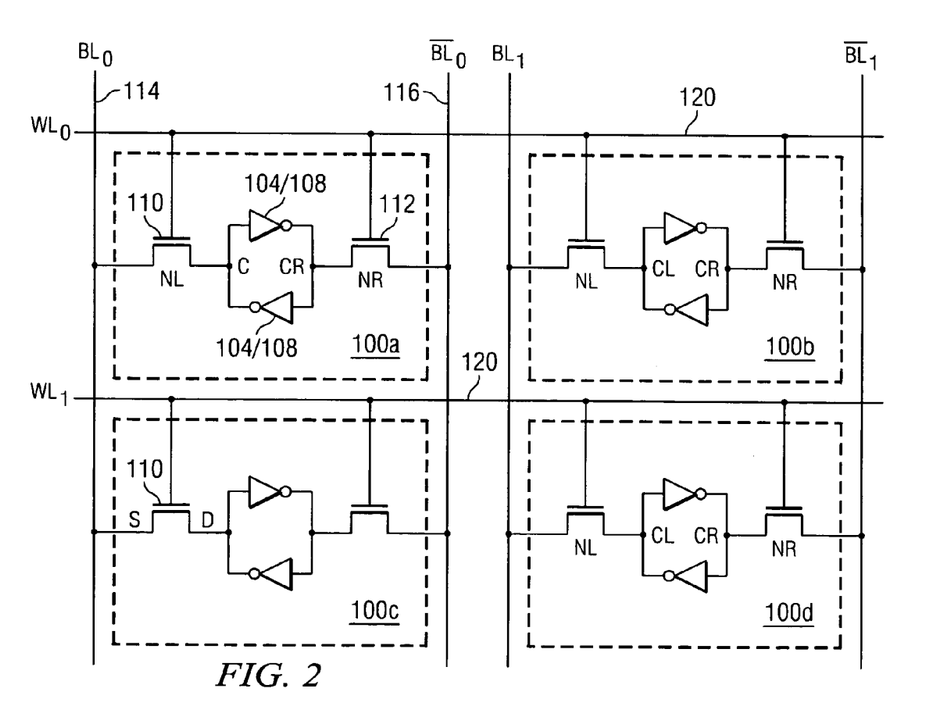
FIG. 2 is a schematic diagram of an SRAM array.

A typical SRAM array includes a matrix of m rows and n columns of the aforementioned SRAM cells 100 as shown in FIG. 2. Cells of the same row share one WL 120 (e.g., $WL_0$ or $WL_1$), while cells of the same column share the same complementary bit line pair 114 and 116 (e.g., $BL_0$ and $\overline{BL}_0$ or $BL_1$ and $\overline{BL}_1$). The aforementioned design is used in many SRAMs, including for example, a 1-mega-bit memory having typically 1024 by 1024 cells 100.

In a prior art SRAM cell configured using PD-SOI transistors, all the transistors in the cell are partially depleted SOI transistors. SRAM cells configured using PD-SOI transistors, however, suffer from problems related to the floating body effect. A floating body region may be charged up when the source and drain of a transistor are biased at the supply voltage.

For example, referring to FIG. 2, assume that $WL_0$ is selected (e.g., at a high voltage level) and $WL_1$ is unselected (e.g., at a low voltage level). The pass-gate transistor 110 of the unselected cell 100c may be an n-channel transistor having the source and drain regions at an initial high potential when a physical "1" is stored in the cell. The p-type body region will be charged up to the same potential level as the source and drain regions. When left bit line $BL_0$ of the unselected cell 100c is suddenly put to ground bias (GND), the source region of the pass-gate transistor is suddenly grounded and the body-source p-n junction will be turned on. The charge accumulated in the floating body will flow out of the transistor, contributing to a parasitic current flow from the transistor into bit line $BL_0$. The current is also known as a parasitic bipolar leakage current. This may degrade the noise margin and stability of the SRAM circuit.

In certain dynamic circuits, the parasitic bipolar effect causes logic state errors if not properly accounted for. In an SRAM array, the parasitic bipolar leakage current contributed by the pass-gate transistors 110 or 112 causes the SRAM array to be up to 20% slower than if the leakage current was non-existent. This is known as the transient bipolar effect and has been reported by Kuang et al. in *IEEE Journal of Solid-State Circuits*, vol. 32, no. 6, pages 837-844, June 1997, which paper is incorporated herein by reference.

In one aspect, the present invention provides a method and system to overcome the shortcomings of the prior art, and to provide a highly manufacturable PD-SOI-like technology that produces FD-SOI type devices to eliminate floating body effects, e.g. history effect. A silicon-on-insulator technology has been successfully developed that integrates PD-SOI and FD-SOI transistors on the same chip. In this patent, the abovementioned SOI technology can be used to form a static random access memory (SRAM) cell that employs both PD-SOI and FD-SOI transistors.

A first embodiment of this invention provides an SRAM cell with both PD-SOI and FD-SOI transistors. Another embodiment of this invention teaches a method of forming such an SRAM cell. By incorporating FD-SOI transistors in critical parts of the SRAM cell that is susceptible to undesirable floating body effects, performance of an SRAM array may be significantly improved. In addition, a structure and method of forming an SRAM cell with FD-SOI and PD-SOI transistors with enhanced performance is provided.

The preferred embodiment of this invention employs an SOI technology that incorporates PD-SOI and FD-SOI transistors in the same manufacturing process, i.e., PD-SOI transistors and FD-SOI transistors may be formed on the same semiconductor substrate and these transistors may be formed in close proximity to each other. Therefore, by using the SOI technology of this invention, a SRAM cell may be designed such that both PD-SOI and FD-SOI transistors may be used. Embodiments of this invention may also employ the option of introducing strain in the channel of these SOI transistors to enhance the performance of the SRAM cell.

The schematic of an SRAM cell according to one embodiment of this invention is depicted in FIG. 1. As discussed above, the schematic diagram of FIG. 1 shows a six-transistor static random access memory (SRAM) cell 100. In the preferred embodiment, both PD-SOI and FD-SOI transistors are incorporated in the same SRAM cell 100.

For example, in one embodiment the four transistors 102, 104, 106 and 108 constituting the two cross-couple inverters are formed from partially depleted SOI transistors. As before, the PD-SOI transistors 102 and 106 constitute the first inverter and the PD-SOI transistors 104 and 108 constitute the second inverter. The two pass-gate transistors 110 and 112, sometimes also known as access transistors, are fully depleted SOI transistors. In the preferred embodiment, the transistors 110 and 112 are both n-channel transistors, although they may be p-channel transistors.

By using FD-SOI transistors as pass-gate or access transistors 110 and 112, the problem associated with the bipolar leakage current or the transient bipolar effect can be avoided. Floating body effects are absent in FD-SOI transistors. FD-SOI transistors do not suffer from floating body effects due to the fact that the body is fully depleted, and no portion of the body region is undepleted. An SOI transistor may have a fully depleted body if it has a low body doping and/or a thin body thickness. Additionally, for good control of short channel effects in ultra-scaled devices, the device body thickness may be reduced to less than one third of the gate length. Such a thin body thickness may require raised source/drain technology for series resistance reduction.

According to another embodiment of this invention, the pull-up transistors 102 and 104 are FD-SOI transistors. In this embodiment, the pass-gate transistors 110 and 112 may be PD-SOI transistors but they are preferably FD-SOI transistors. The pull-down transistors 106 and 108 are preferably PD-SOI transistors but could be FD-SOI transistors.

To this point, the SRAM cells have been described in the context of a memory array, i.e., a two-dimensional matrix of rows and columns of memory cells. The concepts, however, would apply equally to other devices. For example, many latches, registers, FIFOs and other devices include cross-coupled inverters such as those shown in FIGS. 1 and 2. Any of these elements could benefit from aspects of the present invention.

Figure 3:
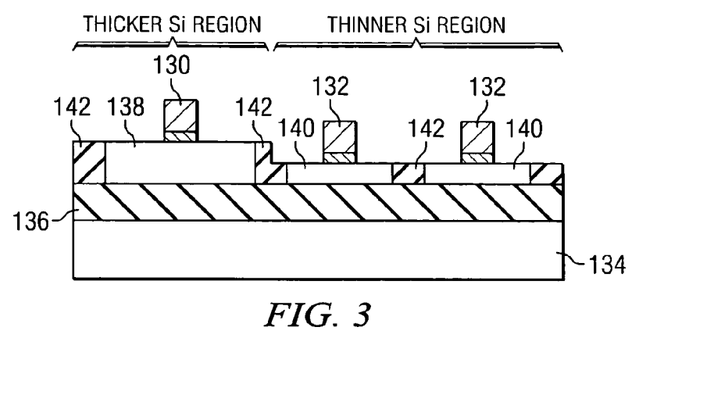
FIG. 3 is a cross-sectional diagram of a first embodiment.

FIG. 3 shows a cross-sectional view of a device that includes a partially depleted SOI transistor 130 and two fully depleted SOI transistors 132. These transistors 130 and 132 are formed on an SOI substrate that includes a substrate 134 (e.g., silicon) and an overlying insulating layer 136 (e.g., a buried oxide). The PD-SOI 130 is formed in silicon layer 138 and FD-SOI transistors 132 are formed in silicon layer 140. Isolation regions 142 isolate separate active areas.

The SRAM cell 100 of FIG. 1 can be implemented using structures as shown in FIG. 3. For example, the FD-SOI transistors in layer 140 mentioned in the first and second structure SRAM embodiments can be implemented where the body thickness is thinner than the maximum depletion width $W_{d,max}$. The depletion width $W_{d,max}$ is given by the equation:

$$W_{d,\max} = \sqrt{\frac{4\varepsilon_s \phi_b}{qN_a}} \qquad (1)$$

where $\epsilon_s$ is the permittivity of the body region of the transistor, q is the electronic charge, $N_a$ is the average doping concentration in the body region of the transistor, and $\phi_b$ is given by $$\phi_b = \frac{kT}{q}\ln\left(\frac{N_a}{n_i}\right) \qquad (2)$$

where k is Boltzmann's constant, T is temperature, and $n_i$ is the intrinsic carrier concentration. For silicon, $n_i$ is $1.45 \times 10^{10}$ cm$^{-3}$.

The doping concentration $N_a$ may be determined indirectly from the known threshold voltage of the transistor using the equation:

$$V_{th} = (\Phi_M - \Phi_S) + 2\phi_b + \frac{\sqrt{4\varepsilon_s q N_a \phi_b}}{\varepsilon_d / t_d} \qquad (3)$$

where $t_d$ is the physical thickness of the gate dielectric, $\epsilon_d$ is the permittivity of the gate dielectric, and $\Phi_M$ is the workfunction of the gate electrode material, and $\Phi_S$ is the workfunction of the material constituting the channel region of the transistor.

Since threshold voltage $V_{th}$ of transistor may be known or easily determined, and the value of $(\Phi_M - \Phi_S)$ is known if the gate electrode material is known, the $V_{th}$ equation given above may be solved for $N_a$. $N_a$ may be determined from $V_{th}$, as described, or determined from other known physical or experimental analysis techniques.

The value of $N_a$ may then be used to compute the maximum depletion width. If the computed $W_{d,max}$ is larger than the thickness of the body region, the transistor is a FD-SOI transistor. If the computed $W_{d,max}$ is smaller than the thickness of the body region, the transistor is a PD-SOI transistor. This is a first way of determining whether a SOI transistor is a FD-SOI transistor or a PD-SOI transistor.

A second way is similar to the first way, by expressing $W_{d,max}$ in terms of $V_{th}$. Rearranging equation (3):

$$\sqrt{(4\varepsilon_s q N_a \phi_b)} = [V_{th} - (\Phi_M - \Phi_S) - 2\phi_b](t_d/\varepsilon_d) \quad (4)$$

Taking reciprocal on both sides and multiplying by a factor $4\varepsilon_s \phi_b$, we obtain $$\frac{4\varepsilon_s \phi_b}{\sqrt{N\varepsilon_s q N_a \phi_b}} = \frac{4\varepsilon_s \phi_b}{(V_{th} - (\Phi_M - \Phi_S) - 2\phi_b) \cdot (t_d/\varepsilon_d)} \quad (5)$$

The left-hand side of equation (5) is $W_{d,max}$, giving $$W_{d,max} = \frac{4\varepsilon_s \phi_b}{\sqrt{N\varepsilon_s q N_a \phi_b}} = \frac{4\varepsilon_s \phi_b}{(V_{th} - (\Phi_M - \Phi_S) - 2\phi_b) \cdot (t_d/\varepsilon_d)} \quad (6)$$

Since $\Phi_S$ for an n-channel transistor is $(4.61+\phi_b)$ and $\Phi_S$ for a p-channel transistor is $(4.61-\phi_b)$, we have:

$$\text{for n-channel transistor } W_{d,max} = \sqrt{\frac{4\varepsilon_s \phi_b}{\{[V_{th} - \Phi_M + 4.61 - \phi_b](t_d/\varepsilon_d)\}}} \quad (7n)$$

$$\text{for p-channel transistor } W_{d,max} = \sqrt{\frac{4\varepsilon_s \phi_b}{\{[V_{th} - \Phi_M + 4.61 - 3\phi_b](t_d/\varepsilon_d)\}}} \quad (7p)$$

A third way is to examine the drain current versus drain voltage ($I_{DS}$–$V_{DS}$) characteristics of the SOI transistor. If kinks or discontinuities in the slope of the $I_{DS}$–$V_{DS}$ characteristics exist, the transistor is a PD-SOI transistor. Otherwise, the transistor is a FD-SOI transistor.

In FIG. 3, PD-SOI and FD-SOI transistors are formed on the same substrate by modifying the thickness, using silicon thickness larger than $W_{d,max}$ for PD-SOI transistors 130 and using silicon thickness smaller than $W_{d,max}$ for FD-SOI transistors 132. In another embodiment, some of the transistors are formed in a silicon layer 140 that is thinner than silicon layer 138, regardless of whether these transistors are FD-SOI or PD-SOI transistors.

In the preferred embodiment, however, the FD-SOI transistors are not formed by modifying the silicon thickness. In the preferred embodiment, the FD-SOI transistors are three-dimensional or FinFET-like FD-SOI transistors, which makes use of a novel device geometry to eliminate floating body effects. In general, planar FD-SOI transistors have widths of more than 50 nm while non-planar fully depleted multiple-gate transistors have widths of less than 50 nm.

Concepts of the formation of both PD-SOI transistors and FD-SOI transistors are more clearly illustrated in FIGS. 4a-4d. FIGS. 4a-4d illustrate PD-SOI transistors and FD-SOI transistors described in a co-pending invention with Ser. No. 10/319,119 entitled "Semiconductor-on-Insulator Chip Incorporating Partially-Depleted, Fully-Depleted, and Multiple-Gate Devices", filed Dec. 12, 2002. The FD-SOI transistor of FIG. 4b uses a low body doping so that the maximum depletion width is larger than the silicon thickness to achieve full depletion. The FD-SOI transistor of FIG. 4d uses a novel geometry to allow the encroachment of gate electric field from the sides of the silicon body to achieve full body depletion.

Figure 4A:
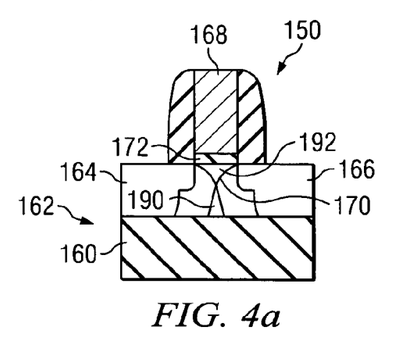
FIGS. 4a-4d illustrate partially depleted SOI transistors and a fully depleted SOI transistors of the present invention.
Figure 4B:
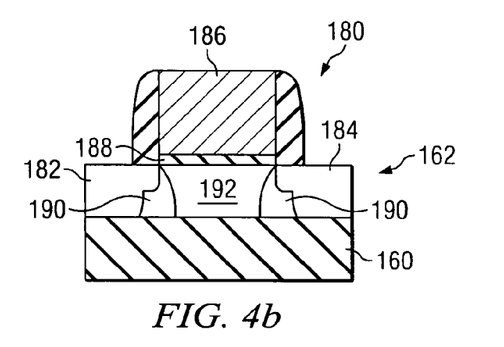

Super-halo doping and light body doping are designed to achieve FD-SOI and PD-SOI devices at different gate lengths, as shown in FIGS. 4a and 4b. Referring first to FIG. 4a, a partially depleted transistor device 150 is formed over a buried insulator 160. While not shown, the buried insulator 160 is formed over a substrate, e.g., an undoped or lightly doped silicon substrate (see substrate 134 in FIG. 3).

The buried insulator 160 is typically an oxide such as silicon dioxide. Other insulators, such as silicon nitride or aluminum oxide, may alternatively be used. In some embodiments, the buried insulator can comprise a stack of layers, e.g., an oxide, nitride, oxide stack.

Transistor device 150 is formed in a semiconductor layer 162 and includes a source region 164 and a drain region 166. A gate 168 overlies a channel 170 and is separated therefrom by gate dielectric 172.

Similarly long-channel transistor 180 includes a source 182, a drain 184, a gate 186, and a gate dielectric 188. The transistor 180 can be formed in the same semiconductor layer 162 as transistor 150 or in a different semiconductor layer e.g., a different island or mesa on the same chips.

One feature is the design of the super-halo doping 190 in FIG. 4b (or double halo doping 190 in FIG. 4a) and light body doping 192 such that the effective doping concentration of the transistor body decreases as the gate length is increased. The doping concentration in the super-halo region 190 is in the range of about $1 \times 10^{18}$ to about $2 \times 10^{19}$ dopants per cubic centimeter. The doping concentration in the lightly doped body region 192 is in the range of about $1 \times 10^{16}$ to about $1 \times 10^{18}$ dopants per cubic centimeter.

In FIG. 4a, the high super-halo doping concentration 190 in a short-channel transistor 150 results in a maximum depletion width that is smaller than the silicon film 162 thickness, and the transistor body is therefore partially-depleted. As the gate 168 length increases, an increasing portion of the body region is constituted by the lightly doped body region 192, and the average effective body concentration decreases. Consequently, the maximum depletion width increases with an increase in the transistor gate length or channel length. In FIG. 4b, the long-channel transistor 180 has a light body doping and a maximum depletion width that is larger than the silicon film 162 thickness, and the transistor body is fully depleted.

Figure 4C:
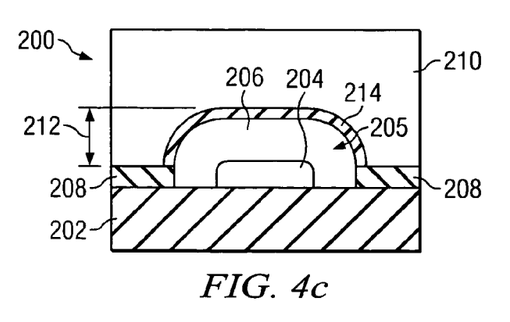
Figure 4D:
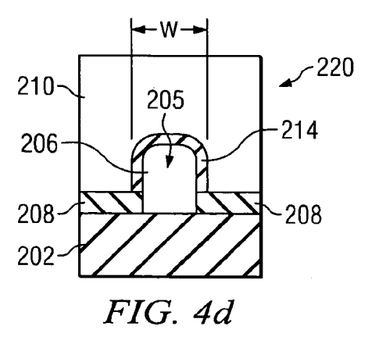

Referring now to FIGS. 4c and 4d, another way to achieve full depletion in the transistor body is to allow the electric field lines to encroach from the sides of the transistor body by using a novel transistor geometry. Referring now to FIG. 4c, a transistor 200 is formed over a buried insulator. The buried insulator 202 can include any of the characteristics described above with respect to insulator 160 and may be formed on a substrate, where the discussion above with respect to FIGS. 4a and 4b equally applies here. In this device, an active semiconductor layer region 205 includes a body region 204 and a depletion region 206. The active region 205 is isolated from the other active regions by isolation region 208. This isolation region 208 is preferably a shallow trench isolation (STI) region. It is understood that other isolation structures may be used.

A gate electrode 210 is formed to surround the transistor active region, e.g., the channel region. Accordingly, an intentional recess 212 is formed within the isolation region 208 so that the semiconductor layer 205 includes sidewalls. The gate electrode 210 is adjacent to the top surface as well as the sidewalls of active layer 205. A gate dielectric layer 214 is formed between the gate electrode 210 and the active layer 205.

The source and drain regions of the transistor device 200 are not shown in the illustration of FIG. 4c. In this case, the channel current flows into and out of the page. As a result, one of the source/drain regions will be located in a plane above the page and the other located in a plane below the page.

FIG. 4d shows a similar structure for a FinFET-like transistor device 220. Like elements from FIG. 4c have been labeled with the same reference numerals. In this case, the active semiconductor layer is thin casing the body to be fully depleted.

One feature of the novel transistor geometry is the intentional recess 212 in the isolation region 208, as shown in FIGS. 4c and 4d. The planar partially depleted transistor 200 of FIG. 4c has a width that is much bigger than the maximum depletion layer width $W_{d,max}$. When the active region width W (see FIG. 4d) is reduced to less than twice the depletion width layer in the body, the gate field encroaches from the isolation edges and eliminates the undepleted body region, thereby making the device of FIG. 4d fully depleted.

The resulting FD-SOI device has a non-planar geometry and is a multiple-gate transistor where the gate electrode 210 surrounds the transistor body 206 on multiple sides: the two sidewalls and the top surface. By having a gate electrode 210 that surrounds the transistor body 205, the multiple-gate transistor allows the encroachment of the gate electric field to the transistor body in the lateral direction, thus enhancing its ability to control short-channel effects.

Figure 5A:
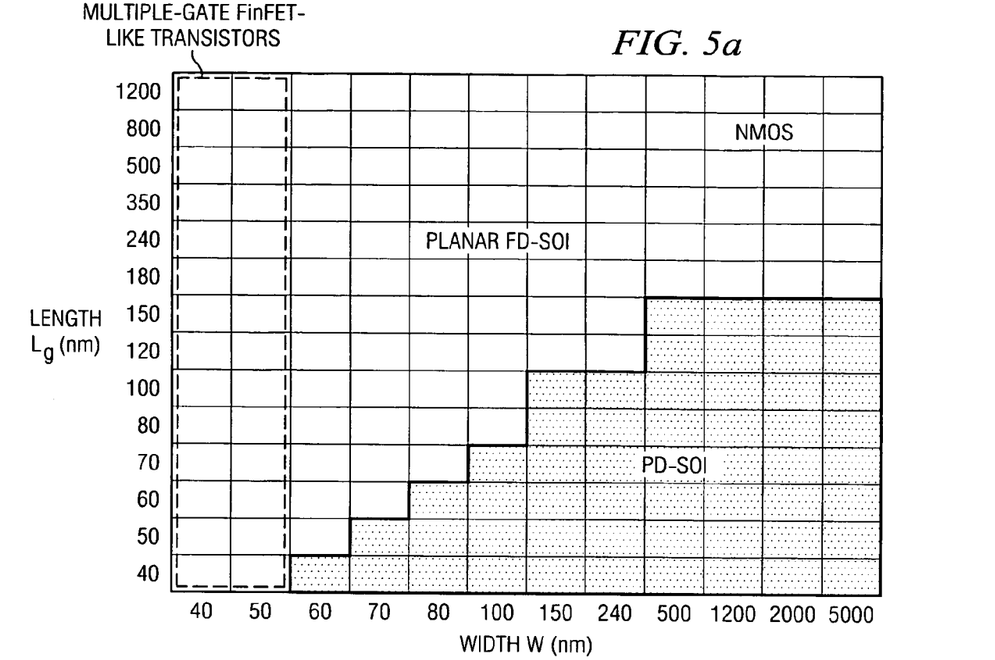
FIGS. 5a and 5b each provide a map showing the region of PD-SOI, FD-SOI, and multiple-gate transistors as a function of width W and length $L_g$ for NMOS (FIG. 5a) and PMOS (FIG. 5b) transistors.
Figure 5B:
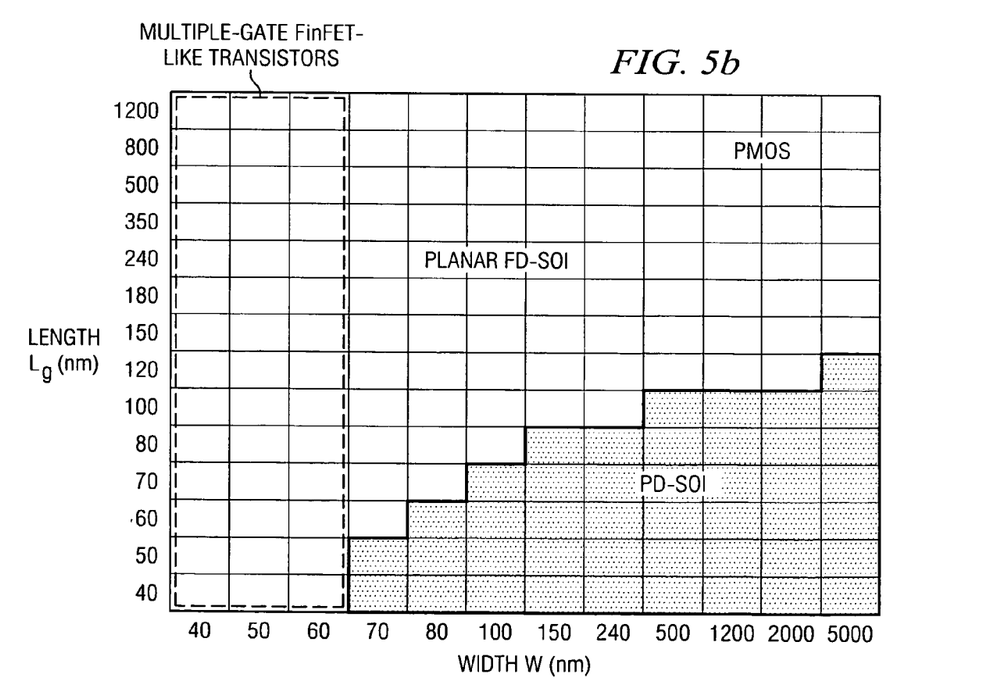

The preferred embodiment of this invention teaches a unique way of incorporating PD-SOI and FD-SOI transistors on the same chip using the same process technology, with a distribution of FD-SOI and PD-SOI transistors according to transistor dimensions. FIGS. 5a and 5b (collectively FIG. 5) show the distribution of the PD-SOI and FD-SOI transistors according to the active region width W and the transistor gate length $L_g$. FIG. 5a provides data for NMOS devices and FIG. 5b shows data for PMOS devices. These figures provide a map showing the region of PD-SOI transistors (gray region), conventional FD-SOI transistors (white region), and multiple-gate transistors (in region enclosed by dashed box) as a function of width W and length $L_g$ for NMOS and PMOS transistors.

Planar PD-SOI and FD-SOI transistors typically have active region width of more than 50 nm, while non-planar multiple-gate fully depleted transistors generally have active region width of less than 50 nm. The results in FIG. 5 are obtained from an experiment where transistors are fabricated using a 65 nm PD-SOI-based process with a nominal gate length of 45 nm, a silicon body thickness of 40 nm, dual-doped poly-silicon gate electrodes, 14 angstroms nitrided gate oxide, and cobalt-silicided source/drain and gate.

The PD-SOI region is smaller for P-channel transistors (FIG. 5b) than for N-channel transistors (FIG. 5a) because the impact ionization induced parasitic bipolar action is weaker in P-channel transistors. The transition from PD- to FD-SOI occurs as the gate length is increased. In addition, the non-planar FinFET-like or multiple-gate transistors are obtained at small width W, typically less than 50 nm. Wide-channel devices with smaller gate length $L_g$ are partially depleted, showing a characteristic kink in the drain current $I_{DS}$ versus drain voltage $V_{DS}$ curves. As W is reduced, transition from PD-SOI to FD-SOI occurs and the characteristic $I_{DS}$-$V_{DS}$ kink disappears.

It is clear that the advantages of PD-SOI and FD-SOI can be combined by using transistors with different combinations of W and $L_g$. For example, when converting a circuit design for bulk technology to a circuit design for SOI technology, critical portions of the circuits may employ FD-SOI devices to achieve minimal floating body effects while the remaining portions of the circuits may employ PD-SOI devices. For example, the critical portions of the circuits may include analog circuits and dynamic circuits.

Figure 6:
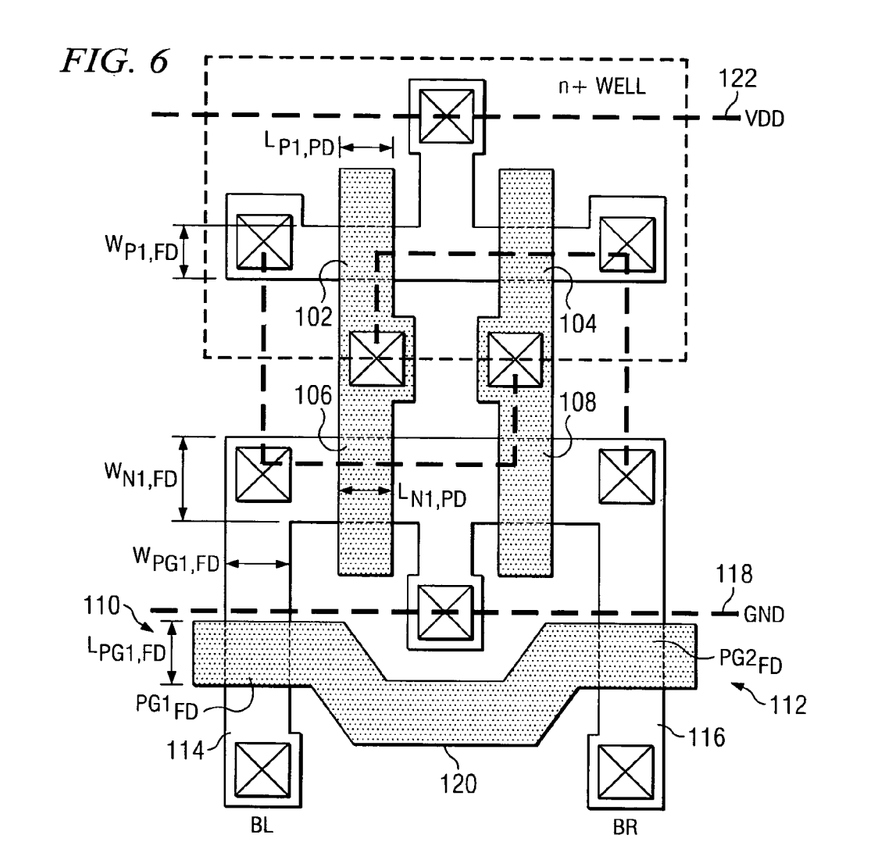
FIG. 6 shows a layout of an embodiment SRAM cell of the present invention.

An example of the layout implementation of an SRAM cell is illustrated in FIG. 6. It is understood that other layout implementations can be used. For the sake of simplicity, metal layout shapes are not shown. In this particular layout, the word line (WL) 120 is shown along the horizontal direction. The left bit line 114, the right bit line 116, and the ground line GND 118 are also shown. The dimensions of the transistors are also labeled. The width and length of each transistor are labeled W and L respectively, and the name of the transistor is indicated in the subscript. For example, $W_{PG1,FD}$ and $L_{PG1,FD}$ label the width and length of the FD-SOI pass-gate transistor labeled 102.

According to the preferred embodiment of this invention, the width and length of the pass-gate transistors 102 and 104 are selected such that they lie in the FD-SOI or multiple-gate transistor regions (white regions) in FIG. 5a if they are n-channel transistors or in the FD-SOI or multiple-gate transistor regions (white regions) in FIG. 5b if they are p-channel transistors. More preferably, the width and length of the pass-gate transistors 102 and 104 are selected such that they lie in the multiple-gate FinFET-like transistor regions. Such transistors typically have layout widths that are about 50 nm or smaller for n-channel transistor and about 60 nm or smaller for p-channel transistor. The gate length for transistors 102 and 104 are selected such that they are typically larger than those of the pull-down transistors 106 and 108. In the preferred embodiment, the pull-down transistors 106 and 108 are PD-SOI transistors.

The ratio of the conductance of pull-down transistor 106 (108) over the conductance of pass-transistor 110 (112) can be used as a basic metric to measure the stability of the SRAM cell or the ability of the cell to retain its data state. This ratio is referred to by CMOS SRAM designers as 'beta' or 'beta ratio'. It is defined as the ratio of the conductance of the pull-down device over the conductance of pass-gate device. The larger the beta ratio, the cell becomes more stable, and its static noise margin (SNM) increases. The conductance of a transistor is approximately proportional to the effective carrier mobility $\mu_{eff}$ and the ratio of the device width to the channel length, i.e., W/L. Accordingly, the beta of the SRAM cell can be approximated by the ratio of $\mu_{eff}$(W/L) of transistor 106 and $\mu_{eff}$(W/L) of transistor 110. If transistors 106 and 110 have the same channel length, then the beta ratio becomes the ratio of the channel width of transistor 106 over the channel width of transistor 110. Depending on the SRAM application, the beta preferably ranges from about 1.8 to about 3.

An SRAM cell of the present invention may additionally employ transistors with strained channel regions. For example, the transistors constituting the SRAM cell of FIG. 1 may all be strained channel transistors. The use of strained channel transistors is expected to enhance the performance of the SRAM cell significantly. According, transistors 110 and 112 may be strained channel FD-SOI transistors, and transistors 102, 104, 106 and 108 may be strained channel PD-SOI transistors. Use of appropriate strain enhances carrier mobility and strain-induced mobility enhancement is another way to improve transistor performance in addition to device scaling.

The incorporation of strain in the channel region of PD-SOI and FD-SOI transistors on the same chip is described in co-pending patent application with Ser. No. 10/426,566 entitled "Semiconductor-on-Insulator Chip Incorporating Strained-Channel Partially-Depleted, Fully-Depleted, and Multiple-Gate Transistors," filed Apr. 30, 2003, and incorporated herein by reference. In this approach, a high stress film is formed over a completed transistor structure. The stressor, i.e. the high stress film, exerts significant influence on the channel, modifying the silicon lattice spacing in the channel region, and thus introducing strain in the channel region.

Figure 7A:
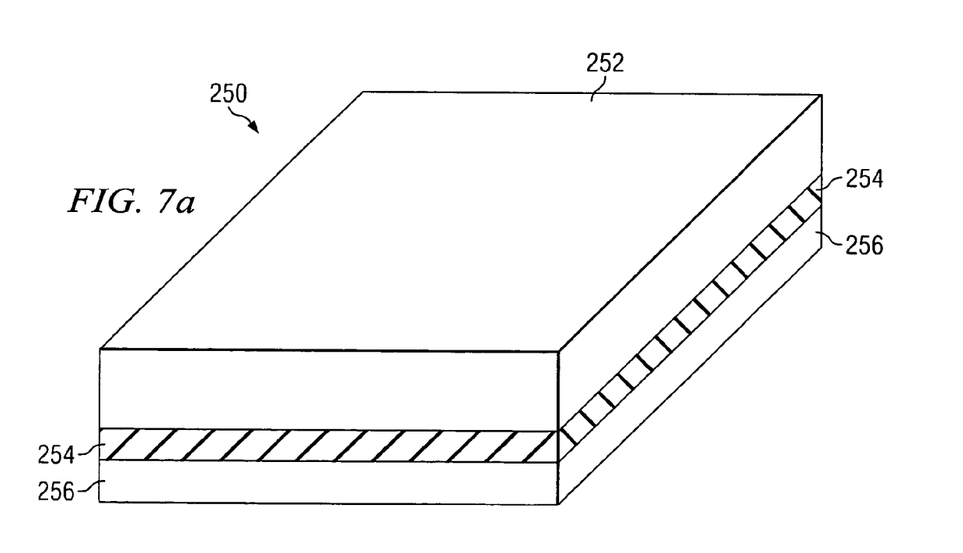
FIGS. 7a-7c and 8a-8b provide perspective views of a device during manufacture.

A method of fabricating the above-mentioned SRAM cell with partially depleted SOI transistors and fully depleted SOI transistors or multiple-gate transistors will be described next with respect to FIGS. 7a-7c. The starting material is a semiconductor-on-insulator wafer 250. The semiconductor-on-insulator wafer comprises of a semiconductor layer 252 overlying an insulator layer 254, which in turn overlies a substrate 256, as shown in FIG. 7a. The semiconductor layer 252 can be an elemental semiconductor such as silicon and germanium, an alloy semiconductor such as silicon-germanium, or a compound semiconductor such as gallium arsenide and indium phosphide. In the preferred embodiment, the semiconductor layer 252 is silicon, preferably monocrystalline silicon.

The insulator layer 254 may be any insulating material such as silicon oxide, aluminum oxide, or silicon nitride. In the preferred embodiment, insulating material 254 is silicon oxide, preferably $SiO_2$. This layer may be deposited on substrate 256 prior to forming semiconductor layer 252. Alternatively, a SIMOX process can be used to implant oxygen into a substrate that initially includes both layers 252 and 256. The underlying substrate 256 may be any semiconductor substrate such as silicon substrate or gallium arsenide substrate. In other embodiments, other substrates such as ceramic or quartz can be used.

In the preferred embodiment, the semiconductor layer 252 is silicon and the insulator 254 is silicon oxide. More preferably, the silicon layer 252 in the preferred embodiment has a thickness in the range of about 10 angstroms to about 2000 angstroms and the silicon oxide layer has a thickness in the range of about 100 to about 2000 angstroms.

Figure 7B:
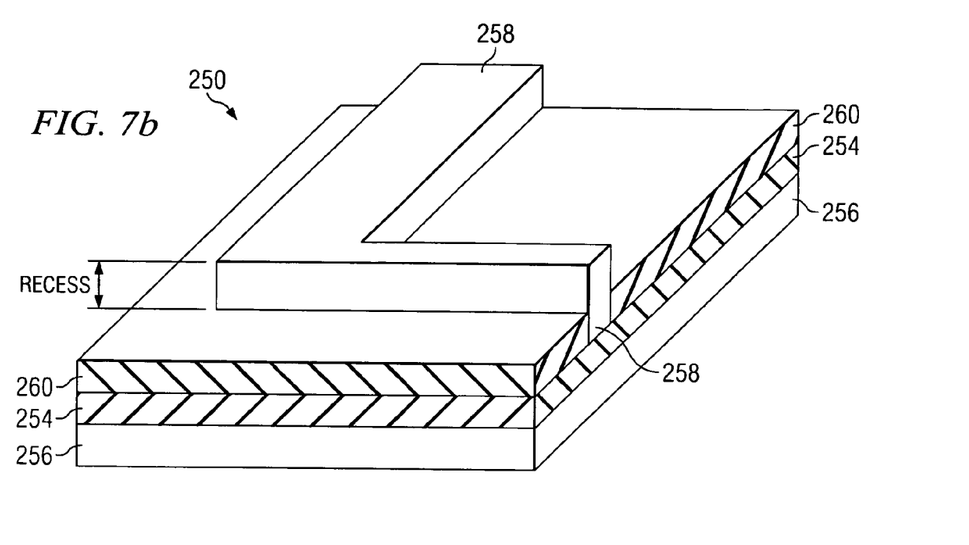

Referring now to FIG. 7b, an active region or silicon fin 258 is formed by patterning the silicon layer 252. The patterning of the active region or silicon fin may be accomplished, for example, by depositing a mask material (not shown) on the silicon layer 252, patterning the mask material by optical lithography to form a patterned mask (not shown), etching the silicon layer 252, and removing the patterned mask. The mask material can be a photoresist, silicon nitride, or a stack comprising of a silicon nitride layer overlying a silicon oxide layer. Isolation regions 260, preferably comprising a dielectric such as silicon oxide are formed to isolate silicon active region 258 from other active regions (e.g., fins) that are not shown in the figure.

Figure 7C:
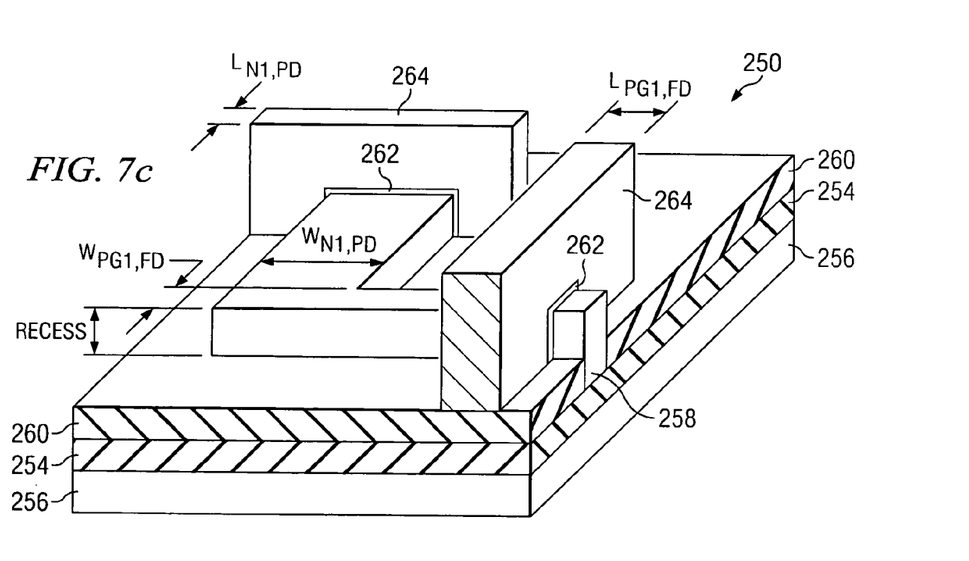

Referring now to FIG. 7c, a gate dielectric is formed. The gate dielectric layer 262 can have a thickness between about 3 to about 100 angstroms. The gate dielectric layer 262 on top of the active region 258 can have a different thickness than the gate dielectric layer 262 on the sidewalls of the active area 258. For example, the thickness of the gate dielectric layer 262 on the top can be thinner than that on the sidewall. In some examples, the thickness of the gate dielectric layer 262 on top of the active region 258 is less than about 20 angstroms.

The gate dielectric may comprise a gate dielectric material such as silicon oxide, silicon oxynitride, or nitrided silicon oxide or combinations thereof. The insulating material may also be a high permittivity material with permittivity larger than 5, such as aluminum oxide ($Al_2O_3$), hafnium oxide ($HfO_2$), hafnium silicon oxynitride (HfSiON), hafnium silicate ($HfSiO_4$), zirconium oxide ($ZrO_2$), zirconium silicate ($ZrSiO_4$), lanthanum oxide ($La_2O_3$).

In the preferred embodiment, the gate dielectric 262 is silicon oxide, which may be formed by thermal oxidation in an oxygen ambient at temperatures ranging from about 500 to about 1000 degrees Celsius. The gate dielectric layer 262 can alternatively be formed by chemical vapor deposition or reactive sputtering. The gate dielectric layer 262 covers the top and the sidewalls of the silicon fin 258.

With the gate dielectric layer 262 appropriately formed, gate electrode material 264 can then be formed on top of the gate dielectric layer 262. The gate electrode material 264 can be formed from poly-crystalline silicon, poly-crystalline silicon germanium, metals, metallic silicides, metallic nitrides, or metallic oxides. For example, metals such as molybdenum, tungsten, titanium, tantalum, platinum, and hafnium may be used as the portion of the gate electrode 264. Metallic silicides may include, but will not be limited to, nickel silicide, cobalt silicide, tungsten silicide, titanium silicide, tantalum silicide, platinum silicide, and erbium silicide. Metallic nitrides may include, but will not be limited to, molybdenum nitride, tungsten nitride, titanium nitride, and tantalum nitride. Metallic oxides may include, but will not be limited to, ruthenium oxide and indium tin oxide.

The gate electrode material 264 can be deposited by conventional techniques such as chemical vapor deposition. For example, the gate electrode can be formed by the deposition of silicon and a refractory metal, followed by an anneal to form a metal silicide gate electrode material. In embodiments, the refractory metal can be titanium, tantalum, cobalt, or nickel.

The gate electrode material 264 is then patterned using photolithography techniques, and etched using plasma etch processes to form the gate electrodes. FIG. 7c shows the gate electrodes of the FD-SOI pass-gate transistor $PG1_{FD}$ and the PD-SOI pull-down transistor $N1_{FD}$ after gate electrode formation (see FIG. 6). The gate length and width of the transistors are also indicated in the three-dimensional figure shown in FIG. 7c. The gate dielectric 262 is retained at least in the portion of the device covered by the gate electrode 264.

Figure 8A:
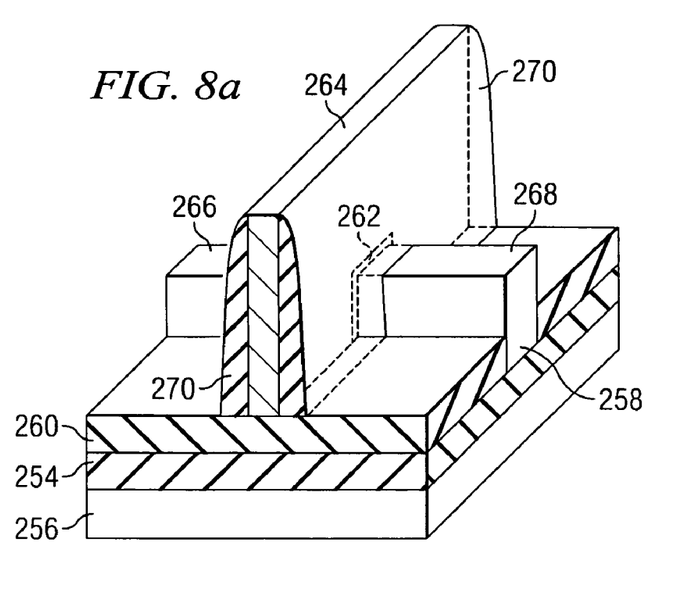

Additional process steps will now be described with respect to FIGS. 8a and 8b, which show only one of the transistors.

The source 266 and drain 268 extensions (e.g., lightly doped source/drain) are then implanted using ion implantation techniques. Super-halo implant may also be performed at this stage. By using implanting the super-halo implant at a large angle ranging from 15 to 45 degrees with respect to the normal of the wafer, devices with short channel lengths will receive a high effective channel doping concentration, while devices with long channel lengths will receive a low effective channel doping concentration.

A spacer 270 is formed using techniques known and used in the art, e.g. deposition of the spacer material and anisotropic plasma etching. The spacer material may comprise of a dielectric material such as silicon nitride or silicon dioxide. In the preferred embodiment, the spacer 270 is silicon nitride.

Following spacer formation, the source and drain regions 266 and 268 are implanted. The source and drain regions can be strapped with one or more conductive materials such as metals and silicides (not shown). The conductive materials can reach the source and drain regions through contacts on the sidewalls and/or the top of the active region.

Figure 8B:
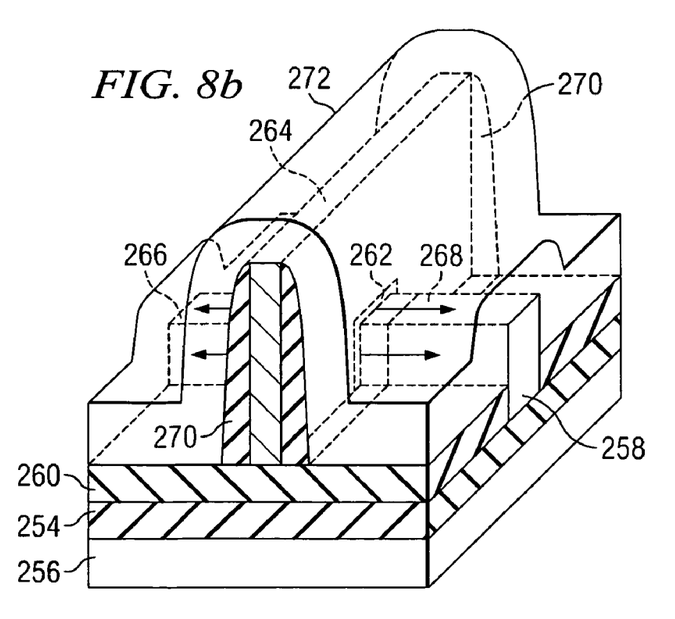

Next, a high-stress film or a stressor 272 is deposited over the completed transistor structure as shown in FIG. 8b. According to this invention, the high stress film contacts not only the top surface but also the sidewall surfaces of the active region 258. As an example, the high-stress film 272 can be PECVD silicon nitride. PECVD silicon nitride can be used to introduce tensile or compressive stress in the channel region. The residual film stress impacts the strain components in the channel. The residual film stress can be tailored from a high state of tension, for stoichiometric silicon nitride, to one of compression, for silicon-rich films. The tensile or compressive nature of the strain in the channel region can therefore be adjusted by varying process conditions such as temperature, pressure, and the ratio of the flow rate of a precursor gas, e.g. dichlorosilane, to the total gas flow rate.

Following the formation of the high-stress film 272, a passivation layer (not shown) is deposited with a thickness of a few thousand angstroms, e.g. 1000 to 5000 angstroms. The passivation layer is preferably comprised of silicon oxide. Contact holes (not shown) are etched through the passivation layer and the high-stress film 272. Conductive materials (not shown) are then used to fill the contact holes to electrically contact the source region 266, drain region 268, and gate electrode 264 of the transistor.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A static memory element comprising:
   a first inverter having an input coupled to a left bit node and an output coupled to a right bit node, wherein the first inverter comprises a first pull-down transistor coupled in series with a first pull-up transistor;
   a second inverter having an input coupled to the right bit node and an output coupled to the left bit node, wherein the second inverter comprises a second pull-down transistor coupled in series with a second pull-up transistor;
   a first fully depleted semiconductor-on-insulator transistor having a drain coupled to the left bit node, wherein the first fully depleted semiconductor-on-transistor insulator has a first conductance that is smaller than a conductance of the second pull-down transistor; and
   a second fully depleted semiconductor-on-insulator transistor having a drain coupled to the right bit node.

2. The static memory element of claim 1 and further comprising:
   a pair of complementary bit limes including a left bit line and a right bit line, wherein the left bit line is coupled to a source of the first fully depleted semiconductor-on-insulator transistor and wherein the right bit line is coupled to a source of the second fully depleted semiconductor-on-insulator transistor; and
   a word line coupled to a gate of the first fully-depleted semiconductor-on-insulator transistor and also to a gate of the second fully depleted semiconductor-on-insulator transistor.

3. The static memory element of claim 1 wherein each of the first and second inverters comprises:
   a partially depleted n-channel pull-down transistor; and
   a p-channel pull-up transistor coupled in series with the n-channel pull-down transistor.

4. The static memory element of claim 3 wherein the p-channel pull-up transistor comprises a partially depleted p-channel pull-up transistor.

5. The static memory element of claim 3 wherein the partially depleted semiconductor-on-insulator transistor has a depletion width and a body thickness, said depletion width being smaller than the body thickness.

6. The static memory element of claim 5 wherein the depletion width is defined by $$W_{d,\max} = \sqrt{\frac{4\varepsilon_s \phi_b}{qN_a}}.$$

7. The static memory element of claim 1 wherein the first and second fully depleted semiconductor-on-insulator transistors comprise silicon-on-insulator transistors.

8. The static memory element of claim 7 wherein the first and second fully depleted semiconductor-on-insulator transistors each has a depletion width and a body thickness, said depletion width being larger than the body thickness.

9. The static memory element of claim 8 wherein the depletion width is defined by $$W_{d,\max} = \sqrt{\frac{4\varepsilon_s \phi_b}{\{[V_{th} - \Phi_M + 4.61 - \phi_b](t_d/\varepsilon_d)\}}}.$$

10. The static memory element of claim 8 wherein the depletion width is defined by $$W_{d,\max} = \sqrt{\frac{4\varepsilon_s \phi_b}{qN_a}}$$

11. The static memory element of claim 1 wherein the first and second fully depleted semiconductor-on-insulator transistors comprise multiple-gate transistors.

12. The static memory element of claim 1 wherein the first and second fully depleted semiconductor-on-insulator transistors comprise n-channel transistors.

13. The static memory element of claim 10 wherein the first and second fully depleted semiconductor-on-insulator transistors comprise n-channel transistors with a channel width of about 50 nm or smaller.

14. The static memory element of claim 1 wherein the first and second fully depleted semiconductor-on-insulator transistors comprise p-channel transistors.

15. The static memory element of claim 14 wherein the first and second fully depleted semiconductor-on-insulator transistors comprise p-channel transistors with a channel width of about 60 nm or smaller.

16. The static memory element of claim 1 wherein the first and second fully depleted semiconductor-on-insulator transistors each has a gate length of about 100 nm or smaller.

17. The static memory element of claim 1 wherein the first and second fully depleted semiconductor-on-insulator transistors each comprise:
a vertical semiconductor fin formed on an insulating layer, the fin having a top surface and two sidewall surfaces, the insulating layer overlying a substrate;
a gate dielectric layer overlying the semiconductor fin;
a gate electrode wrapping around the semiconductor fin on the top surface and the two sidewall surfaces, the gate electrode overlying the gate dielectric layer; and
a source and a drain regions within the semiconductor fin on opposing ends of the gate electrode.

18. The static memory element of claim 17 wherein the insulating layer comprises silicon oxide, silicon oxynitride, or silicon nitride, or combinations thereof.

19. The static memory element of claim 17 wherein the insulating layer has a thickness of between about 20 angstroms and about 1000 angstroms.

20. The static memory element of claim 17 wherein the gate dielectric layer comprises silicon oxide, silicon oxynitride, silicon nitride, or combinations thereof.

21. The static memory element of claim 17 wherein the gate dielectric layer comprises a high permittivity material selected from the group consisting of lanthanum oxide, aluminum oxide, hafnium oxide, hafnium oxynitride, zirconium oxide, and combinations thereof.

22. The static memory element of claim 17 wherein the gate dielectric layer comprises a high permittivity material with a relative permittivity of at least 5.

23. The static memory element of claim 17 wherein the gate dielectric has a thickness of between about 3 and about 100 angstroms.

24. The static memory element of claim 17 wherein the gate dielectric has a thickness on a top surface of the fin that is different than a thickness on a sidewall surface of the fin.

25. The static memory element of claim 24 wherein the gate dielectric thickness on the top surface of the fin is thinner than the gate dielectric thickness on the sidewall of the fin.

26. The static memory element of claim 17 wherein the gate dielectric has a thickness on a top surface of the semiconductor fin that is less than about 20 angstroms.

27. The static memory element of claim 17 wherein the gate electrode is formed from a material selected from the group consisting of poly-crystalline silicon, poly-crystalline silicon germanium, a metal, a metallic nitride, and a metallic silicide, and combinations thereof.

28. The static memory element of claim 1 wherein the first and second fully depleted semiconductor-on-insulator transistors each has a channel region that is strained.

29. The static memory element of claim 1 wherein the first and second inverters each include a partially depleted semiconductor-on-insulator transistor that has a channel region that is strained.

30. A memory array formed from a plurality of static random access memory (SRAM) cells arranged in an n by m matrix, wherein n and m are integers greater than 1, the array comprising:
a plurality of complementary bit line pairs, each bit line pair including a left bit line and a right bit line;
a plurality of word lines;
a plurality of SRAM cells, each SRAM cell comprising:
a first inverter including a first p-channel semiconductor-on-insulator pull-up transistor with a drain coupled to a reference voltage node and a source coupled to the left bit node and a first n-channel semiconductor-on-insulator pull-down transistor with a drain coupled to a ground node and a source coupled to the left bit node;
a second inverter including a second p-channel semiconductor-on-insulator pull-up transistor with a drain coupled to the reference voltage node and a source coupled to the right bit node and a second n-channel semiconductor-on-insulator pull-down transistor with a drain coupled to the ground node and a source coupled to the right bit node;
a first fully depleted semiconductor-on-insulator transistor having a drain coupled to the left bit node, a source coupled to the left bit line of one of the bit line pairs, and a gate coupled to one of the word lines, wherein a conductance of the first n-channel semiconductor-on-insulator pull-down transistor is larger than a conductance of the first fully depleted semiconductor-on-insulator transistor; and
a second fully depleted semiconductor-on-insulator transistor having a drain coupled to the right bit node, a source coupled to the right bit line of the one of the bit line pairs, and a gate coupled to the one of the word lines.

31. The array of claim 30 wherein each of the n-channel pull-down transistors comprises a partially depleted semiconductor-on-insulator n-channel transistor.

32. The array of claim 30 wherein the first and second fully depleted semiconductor-on-insulator transistors comprise multiple-gate transistors.

33. The array of claim 30 wherein the first and second fully depleted semiconductor-on-insulator transistors comprise n-channel transistors.

34. The array of claim 33 wherein each n-channel transistor has a width of about 50 nm or smaller.

35. The array of claim 30 wherein the first and second fully depleted semiconductor-on-insulator transistors each has a gate length of about 100 nm or smaller.

36. The array of claim 30 wherein each of the first and second fully depleted semiconductor-on-insulator transistors has a conductance that is smaller than a conductance of the n-channel pull-down transistors.

37. The array of claim 30 wherein each of the first and second fully depleted semiconductor-on-insulator transistors comprises:
a vertical semiconductor fin formed on an insulator layer, each find having a top surface and two sidewall surfaces, said insulator layer overlying a substrate;
a gate dielectric layer overlying the semiconductor fin,
a gate electrode wrapping around the semiconductor fin on the top surface and the two sidewall surfaces, the gate electrode overlying the gate dielectric layer; and
source and drain regions disposed in the semiconductor fin on opposing ends of the gate electrode.

38. The array of claim 37 wherein the gate dielectric layer comprises a high permittivity material selected from the group consisting of lanthanum oxide, aluminum oxide, hafnium oxide, hafnium oxynitride, zirconium oxide, and combinations thereof.

39. The SRAM cell of claim 30 wherein the first and second fully depleted semiconductor-on-insulator transistors each has a channel region that is strained.

40. The SRAM cell of claim 39 wherein the n-channel pull-down and p-channel pull-up transistors each has a channel region that is strained.

41. A CMOS SRAM cell comprising:
- a pair of p-channel fully depleted transistors (P-FDFETs), each of the P-FDFETs having a common source connected to a voltage potential and a gate connected to a drain of the other P-FDFET;
- a pair of n-channel partially depleted transistors (N-PD-FETs), each of the N-PDFETs having a drain connected to the drain of the respective P-PDFET of the pair of P-FDFETs, a common source connected to ground, and a gate connected to the drain of an opposite P-FDFET of the pair of P-FDFETs;
- a pair of n-channel pass-gate transistors having the drain respectively connected to a connection linking the respective drain of the N-PDFET of the pair of N-PD-FETs to the drain of the P-FDFET of the pair of P-FDFETs, wherein each of the pair of n-channel pass-gate transistors has a conductance that is smaller than a conductance of the n-channel partially depleted transistors;
- complementary bit lines, each of the bit lines respectively connected to the source of the n-channel pass-gate transistor of the pair of n-channel pass-gate transistors; and
- a word line connected to the gates of the n-channel pass-gate transistors.

42. The SRAM cell of claim 41 wherein each of the pair of n-channel pass-gate transistors is a fully depleted transistor.

43. The SRAM cell of claim 41 wherein the pair of p-channel fully depicted semiconductor-on-insulator transistors is a silicon-on-insulator transistor.

44. The SRAM cell of claim 41 wherein the pair of p-channel fully depleted semiconductor-on-insulator transistors is a multiple-gate transistor.

45. The static memory element of claim 1 wherein each of the first and second inverters comprises:
- a fully depleted n-channel pull-down transistor; and
- a p-channel pull-up transistor coupled in series with the n-channel pull-down transistor.

* * * * *

UNITED STATES PATENT AND TRADEMARK OFFICE
CERTIFICATE OF CORRECTION

| | |
|---|---|
| PATENT NO. | : 7,301,206 B2 |
| APPLICATION NO. | : 10/700869 |
| DATED | : November 27, 2007 |
| INVENTOR(S) | : Yeo et al. |

It is certified that error appears in the above-identified patent and that said Letters Patent is hereby corrected as shown below:

On the cover page, Section (56), References Cited, U.S. PATENT DOCUMENTS, Page 2, 9th entry from bottom, delete "Murth" and insert --Murthy--.
On the cover page, Section (56), References Cited, OTHER PUBLICATIONS, Page 2, Column 1, 4th entry, delete "Capacitance-voltage Characteristica" and insert --"Capacitance-Voltage Characteristics--.
On the cover page, Section (56), References Cited, OTHER PUBLICATIONS, Page 2, Column 1, 5th entry, delete "45mm" and insert --45nm--.
On the cover page, Section (56), References Cited, OTHER PUBLICATIONS, Page 2, Column 1, 5th entry, delete "Transistors" and insert --Transistor--.
On the cover page, Section (56), References Cited, OTHER PUBLICATIONS, Page 2, Column 2, 1st entry, delete "50 mm" and insert --50 nm--.
On the cover page, Section (56), References Cited, OTHER PUBLICATIONS, Page 2, Column 2, 14th entry, delete "Dislocation," and insert --Dislocations,--.
On the cover page, Section (56), References Cited, OTHER PUBLICATIONS, Page 2, Column 2, 15th entry, delete "Preperation" and insert --Preparation--.
On the cover page, Section (56), References Cited, OTHER PUBLICATIONS, Page 2, Column 2, 18th entry, delete "Application,"" and insert --Applications,"--.
On the cover page, Section (56), References Cited, OTHER PUBLICATIONS, Page 3, Column 1, 1st entry, delete "Switching-Noise-induced" and insert --Switching-Noise-Induced--.
In Col. 3, line 52, delete "6,120,619," and insert --6,720,619,--.
In Col. 3, line 55, delete "6,867,433 a" and insert --6,867,433,--.

UNITED STATES PATENT AND TRADEMARK OFFICE
CERTIFICATE OF CORRECTION

PATENT NO. : 7,301,206 B2
APPLICATION NO. : 10/700869
DATED : November 27, 2007
INVENTOR(S) : Yeo et al.

It is certified that error appears in the above-identified patent and that said Letters Patent is hereby corrected as shown below:

In Col. 13, lines 59 and 60, delete "semiconductor-on-transistor insulator" and insert --semiconductor-on-insulator transistor--.
In Col. 13, line 66, delete "limes" and insert --lines--.
In Col. 15, line 61, delete "in" and insert --m--.
In Col. 17, line 11, delete "P-PDFET" and insert --P-FDFET--.
In Col. 18, line 11, delete "depicted" and insert --depleted--.

Signed and Sealed this

Eighth Day of April, 2008

JON W. DUDAS
*Director of the United States Patent and Trademark Office*